United States Patent
Jenner et al.

(10) Patent No.: US 11,756,707 B2
(45) Date of Patent: *Sep. 12, 2023

(54) COMMUNICATION CABLE INCLUDING A MOSAIC TAPE

(71) Applicant: Panduit Corp., Tinley Park, IL (US)

(72) Inventors: Royal O. Jenner, Frankfort, IL (US); Timothy J. Houghton, II, Chicago, IL (US); Masud Bolouri-Saransar, Orland Park, IL (US); Ronald A. Nordin, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/943,434

(22) Filed: Sep. 13, 2022

(65) Prior Publication Data

US 2023/0005643 A1    Jan. 5, 2023

Related U.S. Application Data

(63) Continuation of application No. 16/849,018, filed on Apr. 15, 2020, now Pat. No. 11,476,016, which is a
(Continued)

(51) Int. Cl.
*H01G 11/08* (2013.01)
*H01B 11/08* (2006.01)
(Continued)

(52) U.S. Cl.
CPC ........ *H01B 11/085* (2013.01); *B23K 26/0846* (2013.01); *B23K 26/18* (2013.01);
(Continued)

(58) Field of Classification Search
CPC ....... H01B 11/085; H01B 11/02; H01B 11/08; H01B 11/1008; H01B 11/1025;
(Continued)

(56) References Cited

U.S. PATENT DOCUMENTS

| | | | |
|---|---|---|---|
| 2,109,334 | A | 7/1935 | Kaden et al. |
| 3,090,825 | A | 5/1963 | Volk |

(Continued)

FOREIGN PATENT DOCUMENTS

| | | |
|---|---|---|
| DE | 4142855 A1 | 7/1993 |
| EP | 1575063 A2 | 9/2005 |

(Continued)

*Primary Examiner* — Dion R. Ferguson
(74) *Attorney, Agent, or Firm* — Christopher S. Clancy; James H. Williams; Peter S. Lee

(57) ABSTRACT

Cable foil tape having random or pseudo-random patterns or long pattern lengths of discontinuous metallic shapes and a method for manufacturing such patterned foil tape are provided. In some embodiments, a laser ablation system is used to selectively remove regions or paths in a metallic layer of a foil tape to produce random distributions of randomized shapes, or pseudo-random patterns or long pattern lengths of discontinuous shapes in the metal layer. In some embodiments, the foil tape is double-sided, having a metallic layer on each side of the foil tape, and the laser ablation system is capable of ablating nonconductive pathways into the metallic layer on both sides of the foil tape.

19 Claims, 9 Drawing Sheets

Related U.S. Application Data continuation of application No. 15/007,432, filed on Jan. 27, 2016, now Pat. No. 10,650,941, which is a continuation of application No. 14/042,940, filed on Oct. 1, 2013, now Pat. No. 9,269,479, which is a continuation of application No. 12/715,051, filed on Mar. 1, 2010, now Pat. No. 8,558,115.

(60) Provisional application No. 61/157,067, filed on Mar. 3, 2009.

(51) Int. Cl.
  *B23K 26/08* (2014.01)
  *B23K 26/18* (2006.01)
  *H01B 11/10* (2006.01)
  *B23K 26/40* (2014.01)
  *H01B 11/02* (2006.01)
  *H01B 13/26* (2006.01)
  *H05K 1/02* (2006.01)
  *H05K 3/02* (2006.01)
  *B23K 103/16* (2006.01)

(52) U.S. Cl.
  CPC .............. *B23K 26/40* (2013.01); *H01B 11/02* (2013.01); *H01B 11/08* (2013.01); *H01B 11/1008* (2013.01); *H01B 11/1025* (2013.01); *H01B 13/26* (2013.01); *B23K 2103/172* (2018.08); *H05K 1/0224* (2013.01); *H05K 3/027* (2013.01); *Y10T 29/49194* (2015.01)

(58) Field of Classification Search
  CPC .... H01B 13/26; B23K 26/0846; B23K 26/18; B23K 26/40; B23K 2103/172; Y10T 29/49194; H05K 1/0224; H05K 3/02
  See application file for complete search history.

(56) References Cited

U.S. PATENT DOCUMENTS

| | | | |
|---|---|---|---|
| 3,312,774 A | 4/1967 | Peterson | |
| 3,794,750 A | 2/1974 | Garshick | |
| 4,236,779 A | 12/1980 | Tang | |
| 4,684,437 A | 8/1987 | Donelon et al. | |
| 4,782,194 A | 11/1988 | Johnsen | |
| 5,132,488 A | 7/1992 | Tessier et al. | |
| 5,473,336 A | 12/1995 | Harmon et al. | |
| 5,969,295 A | 10/1999 | Boucino et al. | |
| 6,168,458 B1 | 1/2001 | Kraft | |
| 6,624,359 B2 | 9/2003 | Bahlmann et al. | |
| 6,639,152 B2 | 10/2003 | Glew et al. | |
| 6,818,832 B2 | 11/2004 | Hopkinson et al. | |
| 7,332,676 B2 | 2/2008 | Sparrowhawk | |
| 7,335,837 B2 | 2/2008 | Pfeiler et al. | |
| 7,923,641 B2 | 4/2011 | Smith et al. | |
| 8,558,115 B2 | 10/2013 | Jenner et al. | |
| 10,650,941 B2 | 5/2020 | Jenner et al. | |
| 11,476,016 B2 * | 10/2022 | Jenner | H01B 11/085 |
| 2004/0055781 A1 | 3/2004 | Cornibert et al. | |
| 2005/0009307 A1 | 1/2005 | Shigematsu et al. | |
| 2005/0103518 A1 | 5/2005 | Glew | |
| 2005/0190006 A1 | 9/2005 | Noda et al. | |
| 2005/0199416 A1 * | 9/2005 | Somers | H01B 11/02 174/113 R |
| 2006/0048961 A1 | 3/2006 | Pfeiler et al. | |
| 2006/0169478 A1 | 8/2006 | Clark | |
| 2007/0037419 A1 | 2/2007 | Sparrowhawk | |
| 2007/0044996 A1 | 3/2007 | Clark | |
| 2009/0223694 A1 | 9/2009 | Nordin et al. | |
| 2009/0294146 A1 | 12/2009 | Nordin et al. | |
| 2010/0101853 A1 | 4/2010 | McNutt et al. | |
| 2010/0116521 A1 | 5/2010 | Nordin et al. | |

FOREIGN PATENT DOCUMENTS

| | | |
|---|---|---|
| FR | 2176574 A | 11/1973 |
| GB | 1037944 | 8/1966 |
| GB | 2432963 A | 6/2007 |
| JP | S63171912 U | 11/1988 |
| JP | H04-094887 A | 8/1990 |
| JP | 2003-281940 A | 10/2003 |
| TW | 276342 B | 5/1996 |
| TW | 463181 B | 11/2001 |
| WO | 2006105166 A2 | 10/2006 |
| WO | 2008157175 A1 | 12/2008 |
| WO | 2010054283 A3 | 5/2010 |

\* cited by examiner

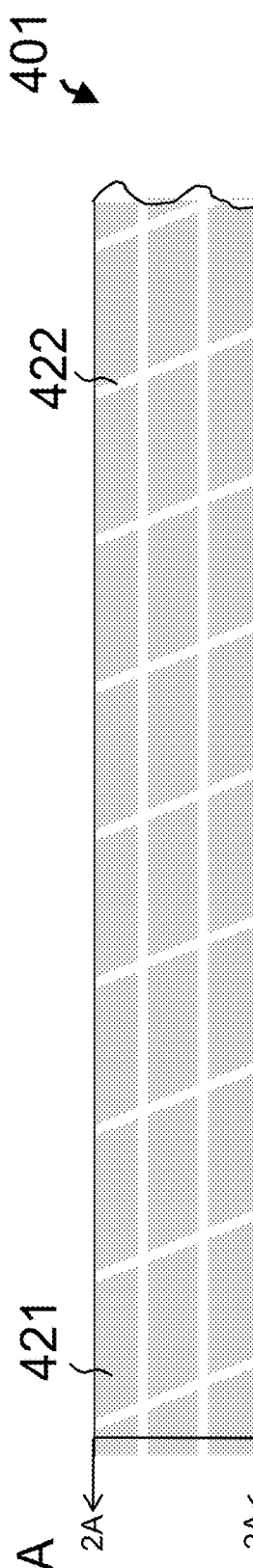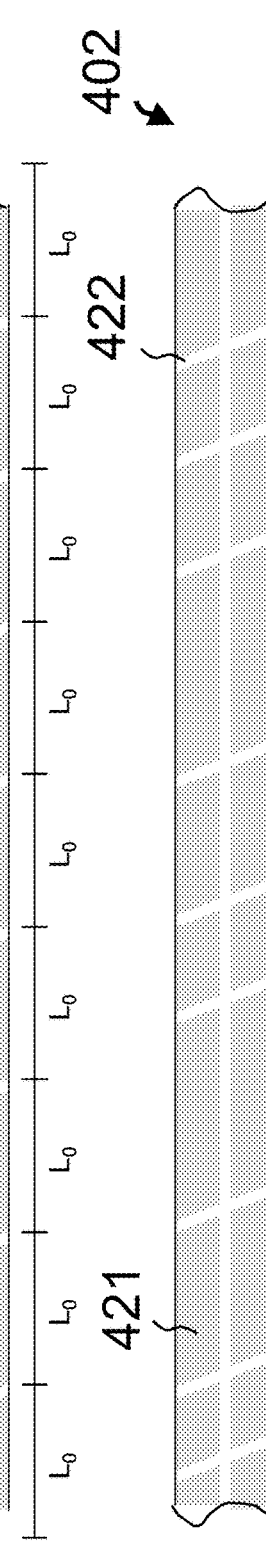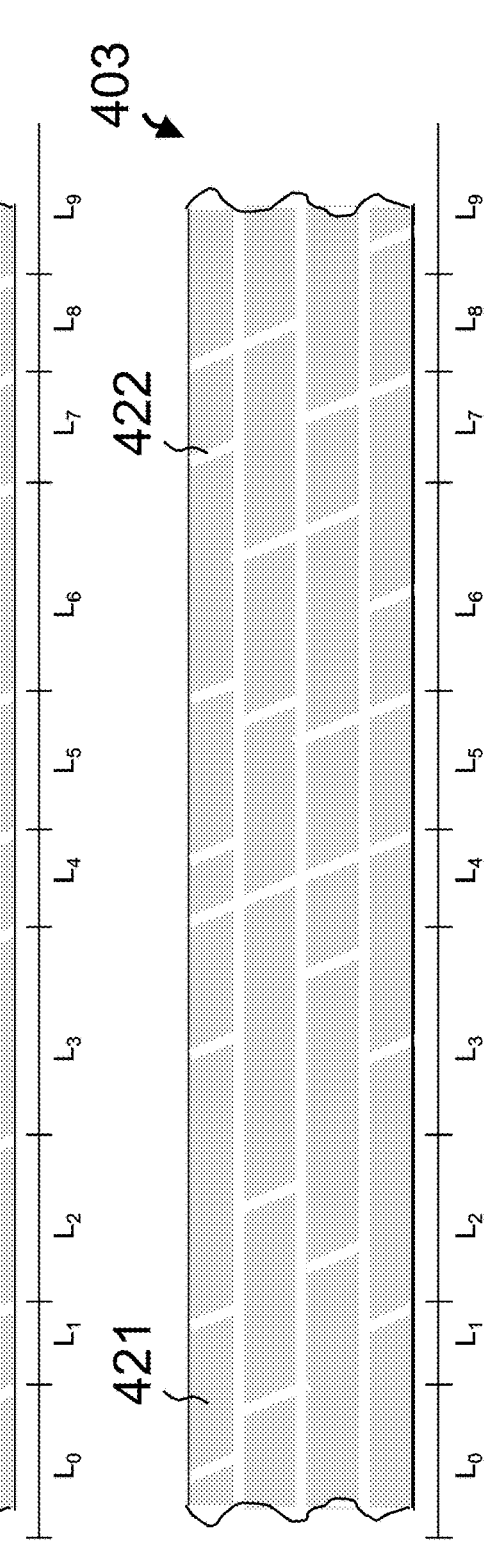

ized mosaic tapes, nor mosaic tapes that have random or pseudo-random periodic pattern lengths that are longer than conventional fixed length lengths.

COMMUNICATION CABLE INCLUDING A MOSAIC TAPE

CROSS-REFERENCE TO RELATED APPLICATION(S)

This application is a continuation of U.S. patent application Ser. No. 16/849,018, filed Apr. 15, 2020; which is a continuation of U.S. patent application Ser. No. 15/007,432, filed Jan. 27, 2016 (which issued as U.S. Pat. No. 10,650,941 on May 12, 2020); which is a continuation of U.S. patent application Ser. No. 14/042,940, filed Oct. 1, 2013 (which issued as U.S. Pat. No. 9,269,479 on Feb. 23, 2016); which is a continuation of U.S. patent application Ser. No. 12/715,051, filed Mar. 1, 2010 (which issued as U.S. Pat. No. 8,558,115 on Oct. 15, 2013); which claims the benefit of U.S. Provisional Application Ser. No. 61/157,067, filed Mar. 3, 2009, the entirety of all of which are hereby incorporated by reference herein.

FIELD OF THE INVENTION

The present invention is generally directed to communication cables and more specifically directed to mosaic tape having fixed, random and/or pseudo-random pattern lengths for use in communication cables, and manufacturing methods for producing mosaic tapes.

INCORPORATION BY REFERENCE

The present application incorporates by reference in their entireties the following U.S. Provisional Patent Applications:

1. Ser. No. 61/034,312, filed Mar. 6, 2008 and entitled, "Communication Cable with Improved Crosstalk Attenuation."

2. Ser. No. 61/054,330, filed May 19, 2008 and entitled, "Communication Cable with Improved Crosstalk Attenuation."

3. Ser. No. 61/112,794, filed Nov. 10, 2008 and entitled "Communication Cable with Improved Crosstalk Attenuation."

BACKGROUND OF THE INVENTION

In the development of 10 Gigabit per second (Gbps) network cable (for example, Category 6A cable), the alien crosstalk specification parameters (as defined in the ANSI/TIA/EIA-568-C.3 specification) have been challenging specification parameters to satisfy. Through the use of a mosaic tape (i.e., a plastic tape having discontinuous metallic shapes on one or both sides of the plastic tape), alien crosstalk can be reduced such that the alien crosstalk specification parameter can be met. However, due to tool-set limitations of current mosaic tape manufacturing processes, such as die-cutting, only fixed-shaped-metallic patterns or variable-metallic patterns that have relatively short-period lengths can be fabricated. Further, when manufactured using conventional processes, gaps between metallic shapes of the mosaic tape are wider than what is generally desired in order to adequately reduce alien crosstalk. Also, the costs associated with conventional manufacturing of mosaic tape tend to be relatively expensive.

There is a need in the art for a method and apparatus to improve the reduction in alien crosstalk and to improve the frequency response of cables having one or more twisted-pair signal wires.

SUMMARY OF THE INVENTION

According to some embodiments, the present invention provides improved reduction of alien crosstalk by forming fixed metallic patterns according to a design or pattern of metallic shapes or strips (primarily with respect to the longitudinal length of the pattern) such that undesirable electromagnetic couplings are not generated between the mosaic tape and the twisted wire pairs that the mosaic tape is wrapped around. An undesirable coupling is shown in graph 101 of FIG. 1A. FIG. 1A shows a coupling peak 106 in the power sum alien near end crosstalk (PSANEXT) performance spectrum 107 of a communication link, which is caused by the interaction of a prior art mosaic tape with the twisted wire pairs. The tested link fails to satisfy the alien crosstalk specification upper limit 105, (the PSANEXT specification under the Category 6a of ANSI/TIA/EIA-568-C.3 Cabling Standard). Mosaic tapes having metallic shapes with periodic pattern lengths according to the present invention are designed such that the pair lay lengths of each of the wire pairs are taken into account in order to prevent such unwanted couplings in the alien crosstalk performance spectrum from occurring. These limitations can act to restrict the selection of mosaic pattern lengths, as well as to restrict the tolerances of the mosaic tape and/or limit the range and tolerance of pair lay lengths of the twisted pairs within the cable.

One technique for reducing the magnitude of the potential coupling between the mosaic tape and the twisted pairs is to fabricate a non-fixed length and/or a non-fixed shape pattern within the mosaic tape, such as a random pattern or a pseudo-random pattern that appears random and/or non-coupling at the frequencies of interest. Frequencies of interest include, but are not limited to frequencies of cabling applications such as Cat 5e (up to 100 MHz); Cat 6 (up to 250 MHz); Cat 6a (up to 500 MHz); cable used in 40G Base-CR4 (up to 10 GHz); and cable used in 100G Base-CR10 (up to 10 GHz). These frequencies have wavelengths, λ, in the range of a few centimeters to a many meters. To avoid couplings due to a short repeated pattern (wherein the repeated pattern or portions of the pattern are of a length that generates a coupling), if the mosaic pattern is to be repeated, the repeated pattern should be as long as possible. For example, in one embodiment the pattern should be longer than the wavelength of the coupling frequencies. In some embodiments of the present invention, repeated pattern lengths greater than approximately five meters (5 m) are used. However, if the mosaic elements are too long they can create electromagnetic compatibility problems, the worst case being a conductive element which is as long as its respective cable, in which case it acts like an un-terminated shield. The present invention fills a need in the art for a method and apparatus for better reduction of alien crosstalk and higher frequency capabilities, by fabricating mosaic tape with narrow gap spacing between metallic portions and with random or pseudo-random patterns having a long repeat length, or even no repetition of the pattern for the length of the cable. The narrow gap between metallic shapes is advantageous for several reasons. The use of narrow gaps allows for the use of a single-sided mosaic tape which lowers the cost of the tape and makes the tape thickness much thinner, resulting in an overall smaller cable diameter. Narrower gaps between metallic shapes also improve alien crosstalk performance. A laser ablation system, as described below, may be used in a method by which random or pseudo-random patterns of metallic shapes are fabricated. The method provides high flexibility of pattern shapes and repeat lengths.

In some embodiments, the present invention provides a cable having reduced alien crosstalk and an apparatus, method, and system for manufacturing the cable with reduced alien crosstalk. The cable with reduced crosstalk may include a plurality of twisted pairs of insulated conductors, a laminate film having a fixed, random, and/or pseudo-random length patterned metallic layer wrapped around the plurality of twisted pairs, and an insulating cable jacket that has a central longitudinal axis that encloses the twisted pairs of insulated conductors, wherein the metallic layer on the mosaic tape provides electrical and magnetic attenuation between wire-pairs within the cable and wire-pairs within a second cable, thereby reducing alien crosstalk. In addition, improved placement and widths of gaps within the metallic layer can reduce couplings between the twisted wire pairs and the laminate film.

The present invention provides for an office, school, hospital, government facility, transportation vehicle, and residential or manufacturing buildings with an installed cable "plant" of high-speed (e.g., up to 10 Gbps or more) interconnection cables, wherein the cable plant is or can be part of an integrated network of computer servers and clients. One example of such an interconnection cable 150 is shown in FIG. 1B.

In some embodiments, an apparatus according to the present invention comprises a film payoff mechanism (described further below) configured to payoff a film, at least one laser configured to emit laser light that impinges on the film and ablates away a portion of the film to generate gaps in a metallic layer of the film, and a film take up mechanism configured to take up the film after the film has passed through the ablation step.

BRIEF DESCRIPTION OF THE DRAWINGS

FIG. 4A is a top view of a fixed mosaic pattern according to some embodiments of the present invention.

FIG. 4B is a top view of a random or pseudo-random mosaic tape according to some embodiments of the present invention.

FIG. 4C is a top view of another random or pseudo-random mosaic tape according to some embodiments of the present invention.

The examples set out herein illustrate preferred embodiments of the invention, and such examples are not to be construed as limiting the scope of the invention in any manner.

DETAILED DESCRIPTION OF THE ILLUSTRATED EMBODIMENTS

In the following detailed description of the preferred embodiments, reference is made to the accompanying drawings that form a part hereof, and in which are shown by way of illustration specific embodiments in which the invention may be practiced. Other embodiments may be utilized without departing from the scope of the present invention.

Further, it is to be understood that the drawings do not necessarily illustrate gaps in the metallic layers of tapes according to the present invention to scale. For illustration purposes, the gaps between metallic portions of the metallic layer have been illustrated wider than scale illustrations would indicate.

Figure 1A:
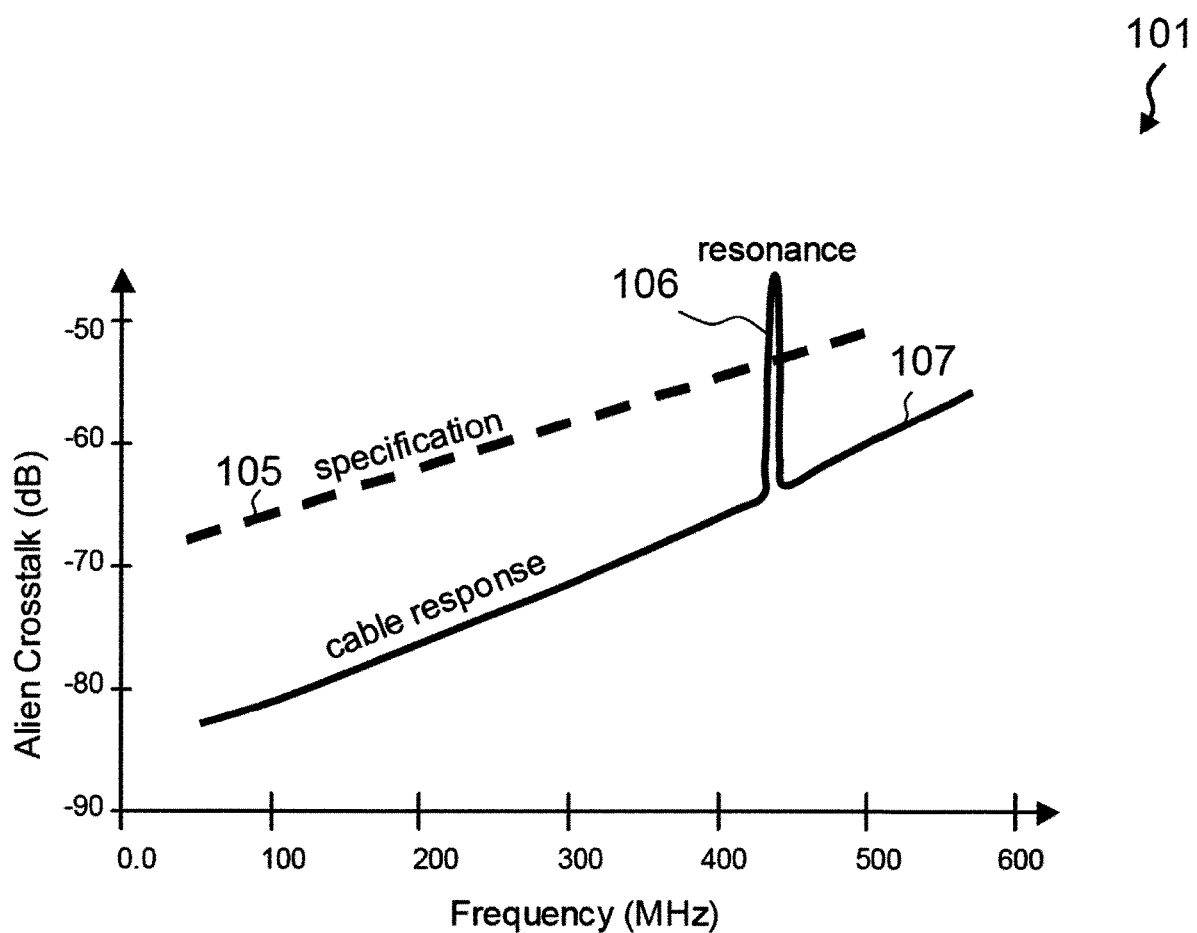
FIG. 1A is a graph showing an alien crosstalk performance spectrum having a coupling peak caused by the interaction of a prior art mosaic metallic tape with one or more of the twisted wire pairs.
Figure 1B:
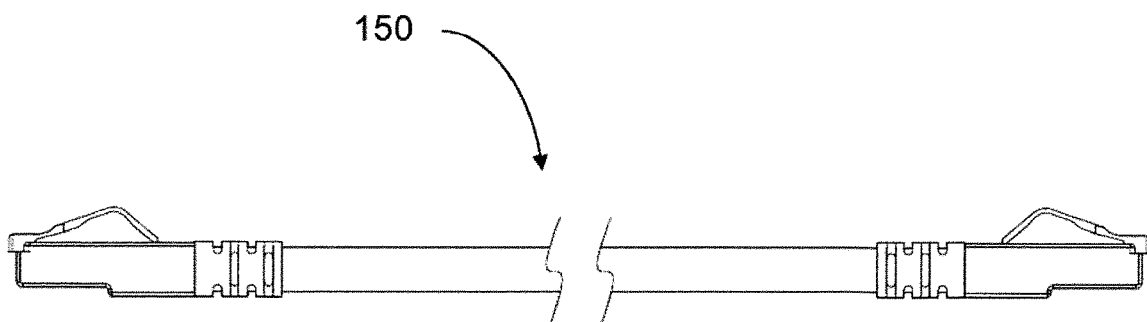
FIG. 1B is an example of an interconnection cable according to some embodiment of the present invention.
Figure 2A:
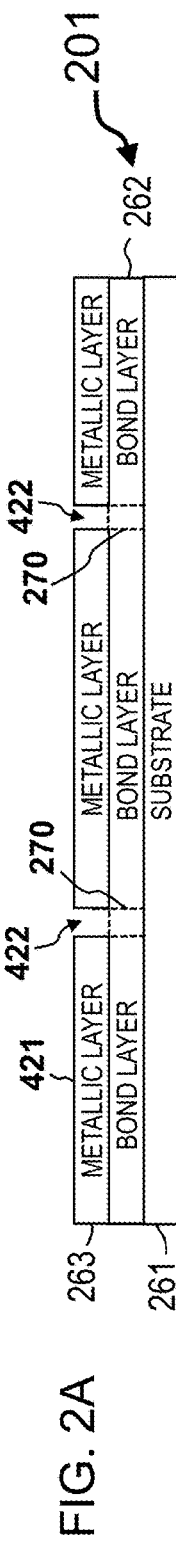
FIG. 2A is a cross-sectional diagram of cable tape according to some embodiments of the present invention taken along section line 2A-2A in FIG. 4A.

FIG. 2A is a cross-sectional diagram of film 201 along the line segment 2A-2A shown in FIG. 4A, according to some embodiments of the present invention. Film 201 includes substrate 261, bond layer 262 and metallic layer 263, wherein the bond layer 262 is used to connect the metallic layer 263 to the substrate 261. Substrate 261 is a flexible low dielectric-constant material polymer (e.g., ethylene copolymer) with a thickness of around 25 micrometers. In some embodiments, the thickness of the substrate 261 is between 5 micrometers and 500 micrometers or ranges within that range. Metallic layer 263 is a highly conductive metal (e.g., aluminum, gold, silver, copper or the like) and has a thickness of around 10 micrometers. In some embodiments, the thickness of the metallic layer 263 is between 0.1 micrometers and 100 micrometers or ranges within that range. Bond layer 262 may be a non-conductive glue, and further, bond layer 262 may be a non-conductive glue with a color pigment added to the glue in order to more readily absorb a particular wavelength of laser light. When the laser light beam is incident onto the metallic layer 263 of film 201, the illuminated metallic section 422 absorbs the incident energy and ablates the metallic material. In this manner the isolated metallic shapes 421 are produced. During this process, the illuminated material 270 in the bond layer 262, can also be ablated.

Figure 2B:
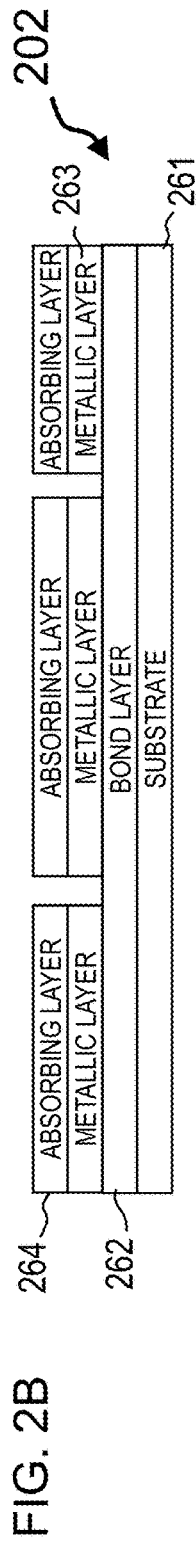
FIG. 2B is a cross-sectional diagram of cable tape according to some embodiments of the present invention.

FIG. 2B is a cross-sectional diagram of film 202 according to some embodiments of the present invention. Film 202 is similar to film 201 as described above, except that film 202 includes an absorbing layer 264 on top of the metallic layer 263 that is used to more readily absorb a particular wavelength of laser light or to reduce the reflection of laser light incident on metallic layer 263.

Figure 2C:
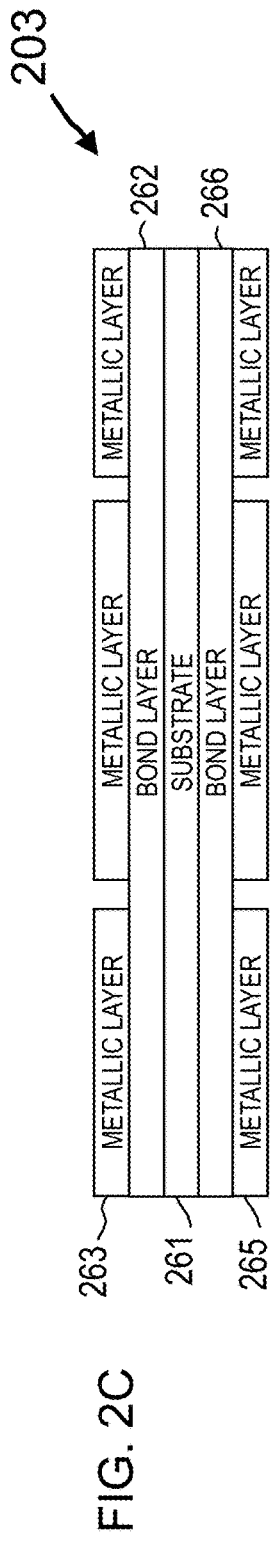
FIG. 2C is a cross-sectional diagram of cable tape according to some embodiments of the present invention.

FIG. 2C is a cross-sectional diagram of film 203 according to some embodiments of the present invention. Film 203 is similar to film 201 as described above, except that film 203 includes a second metal layer 265 and a second bond layer 266, wherein bond layer 266 is used to connect metallic layer 265 with the substrate 261. Metallic layer 265 is a highly conductive metal (e.g., aluminum, gold, silver, copper or the like) and has a thickness of around 10 micrometers. In some embodiments, the thickness of the metallic layer 265 is between 0.1 micrometers and 100 micrometers or ranges within that range. In some embodiments, bond layer 266 is a non-conductive glue. In some other embodiments, bond layer 266 is a non-conductive glue with a color pigment added to the glue in order to more readily absorb a particular wavelength of laser light. In some embodiments, metallic layer 263 and metallic layer 265 are formed from the same metal and have the same thickness. In some other embodiments, metallic layer 263 and metallic layer 265 are formed from different metals and can have different thicknesses.

Figure 2D:
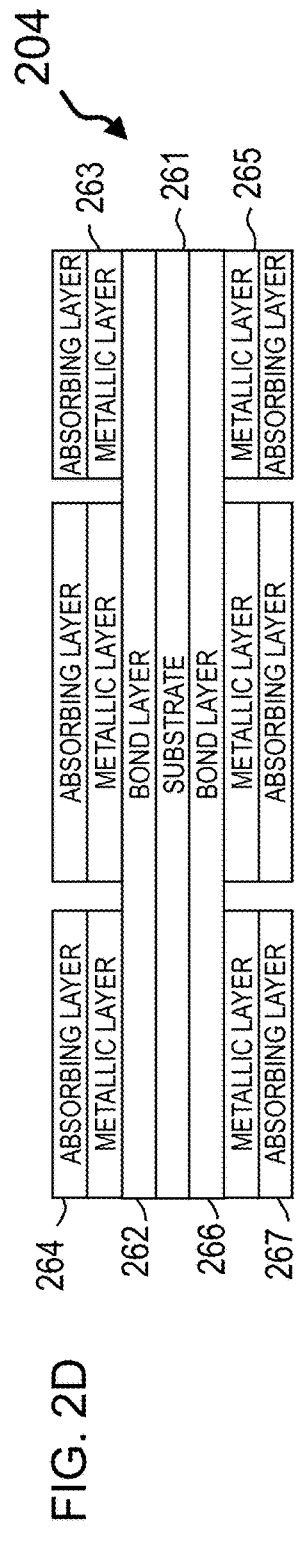
FIG. 2D is a cross-sectional diagram of cable tape according to some embodiments of the present invention.

FIG. 2D is a cross-sectional diagram of film 204 according to some embodiments of the present invention. Film 204 is similar to film 203 as described above, except that film 204 includes absorbing layer 264 on top of metallic layer 263 and a second absorbing layer 267 on top of metallic layer 265.

Figure 3A:
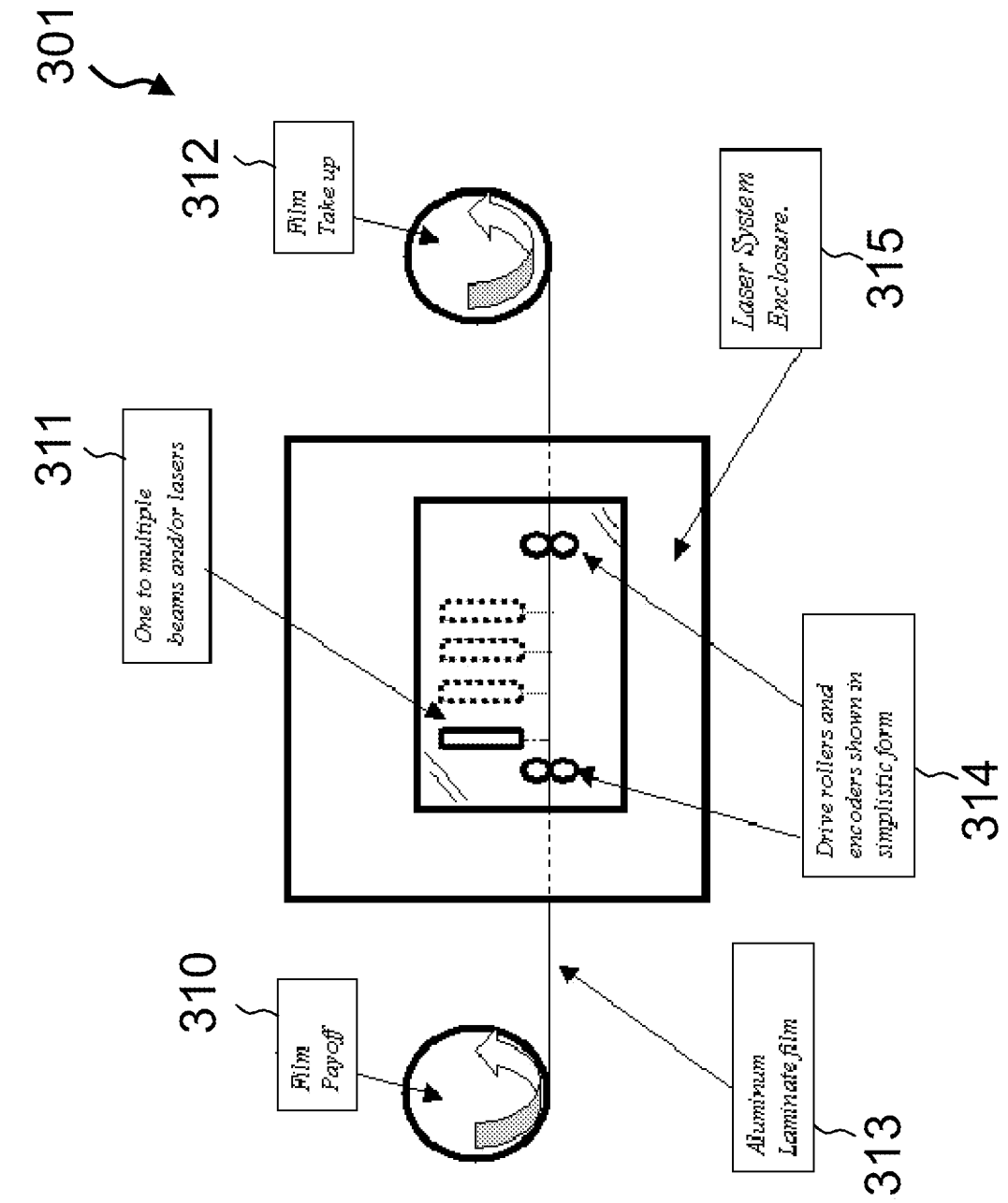
FIG. 3A is a schematic diagram of a laser ablation system according to some embodiments of the present invention.

FIG. 3A is a schematic diagram of a laser ablation system 301 for fabricating fixed, random and/or pseudo-random patterns on a metallic cable tape according to some embodiments of the present invention. Laser ablation system 301 includes a film payoff mechanism to payoff a film 313 wherein film 313 is contained on a cylindrical (or similar) payoff spool 310, drive rollers and encoders 314 to move film 313, one or more lasers 311 used to pattern film 313, and a film take up mechanism to take up film 313 onto a cylindrical take up spool 312 after film 313 has been patterned. The one or more lasers 311 may be contained within an enclosure 315 to prevent operators from being injured by the laser light, and film 313 passes through enclosure 315 where film 313 is patterned by the one or more lasers 311. The film 313 enters enclosure 315 on a first side and exits enclosure 315 on a second and opposite side. Accordingly, all the components may be contained within enclosure 315. That is, the film payoff mechanism 310, film 313 contained on a cylindrical payoff spool, the drive rollers and encoders 314, the one or more lasers 311 used to pattern film 313, and the film take up mechanism 312 used to take up film 313 onto a cylindrical take up spool after film 313 has undergone an ablation process may all be contained within the enclosure 315.

The one or more lasers 311, may be semiconductor (diode or otherwise) lasers, fiber lasers, pulsed-fiber lasers, gas lasers, solid state lasers, liquid lasers, chemical lasers or the like, and emit a laser light having a wavelength of, preferably, around 1064 nm. In some embodiments, the wavelength of the laser light emitted by the one or more lasers 311 is in the range of 100 nm to 1800 nm.

The one or more lasers 311 are used to ablate a conductive layer (e.g., aluminum, gold, silver, copper or the like and alloys thereof) from a substrate (e.g., polymer). The one or more lasers may require the use of beam guidance or delivery technology such as lenses, mirrors, beamsplitters, motors, light pipes, fiber optics and the like (none of which are shown in FIG. 3A). The one or more lasers 311 preferably have a wavelength that is selected such that the laser light penetrates through the polymer substrate leaving the polymer substrate unharmed. The laser light produced by the one or more lasers 311 may be absorbed by a bond layer (e.g., a non-reflective glue layer used to connect the polymer substrate and the metallic layer or a glue layer that has a color pigment added in order to more readily absorb a particular wavelength of laser light and is used to connect the polymer substrate and the metallic layer) to heat up the metallic layer. This heat selectively vaporizes the metallic layer and possibly the bond layer thereby creating a non-conductive path through the metallic layer. This forms an arrangement of metallic shapes separated from one another by non-conductive gaps in a mosaic-type arrangement, and the resulting tape may be called a "mosaic tape."

Alternatively, the laser light produced by the one or more lasers 311 impinges directly on the metallic layer, without first traveling through the substrate or the bond layer, and selectively ablates the metallic layer down to the bond layer or the substrate, thereby creating a non-conductive path in the metallic layer. The metallic layer may be coated with an absorbing layer used to enhance the absorption of the laser light impinging on the metallic layer to improve the ablation efficiency.

Figure 3B:
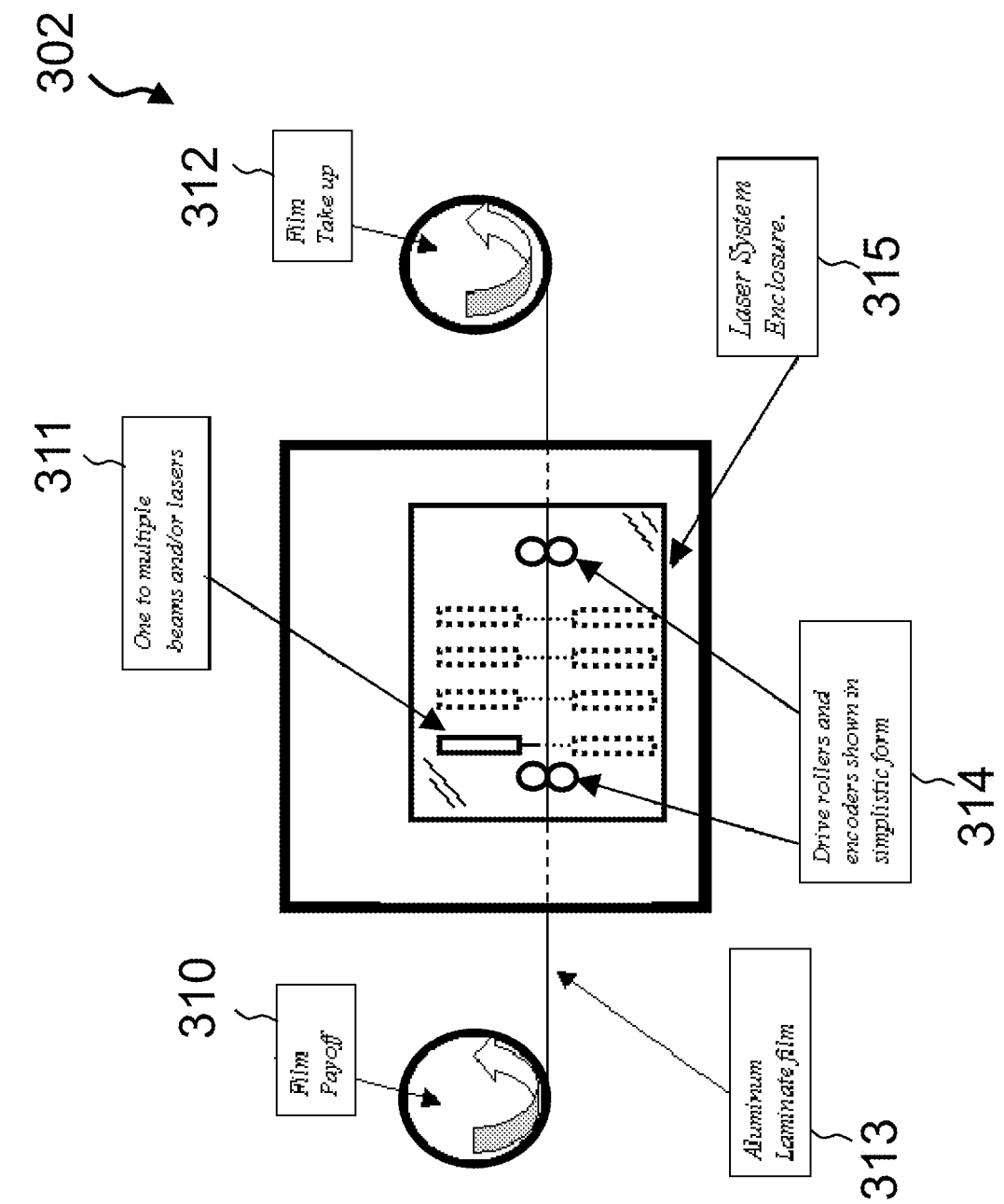
FIG. 3B is a schematic diagram of a laser ablation system according to some embodiments of the present invention.

The laser ablation system 301 can be installed at many locations on a manufacturing line (e.g., as a stand alone system as shown in FIG. 3A or 3B, as part of a web slitting system, on-line at a cabler (twinner, strander, and/or extrusion/jacketing), or as part of other cable manufacturing processes).

Some advantages of using laser ablation system 301 for the manufacture of mosaic tape are as follows:

1. The use of laser ablation provides a very small gap between metallic shapes (this improves performance) which is not possible with mechanical systems such as die cutting. According to some embodiments of the present invention, gaps of from about 0.5 mil to about 8 mil in width are created between the conductive shapes, in combination with conductive shape lengths of from 0.75 inch to 2.5 inches;

2. Provides an easily changeable pattern or randomization length for the metallic shapes (which can be flexibly modified to be short, long, or infinite); and 3. Provides the ability to implement a wide variety of geometric shapes for the metallic shapes, from regular and irregular polygons to simple and complex curved shapes and combinations thereof (to improve performance).

FIG. 3B is a diagram of a laser ablation system 302 according to some embodiments of the present invention. Laser ablation system 302 is similar to laser ablation system 301 as described above, except that the one or more lasers 311 or beams of laser ablation system 302 can be located on either side of the film 313, thereby allowing laser light to impinge on both surfaces of the film 313.

In some embodiments, film 313 is preferably similar to film 201 or film 202 as shown in FIG. 2A and FIG. 2B, respectively, and described above. In these embodiments, laser light from one or more lasers located above the top surface of film 313 and one or more lasers located below the bottom surface of film 313 illuminates both surfaces of film 313 individually or substantially simultaneously. For example, if the film 313 is oriented such that the metallic layer is the top surface and the substrate is the bottom surface, the laser light from the beam or beams located above the top surface directly impinges on the metallic layer (or the absorbing layer as described in FIG. 2B) to selectively ablate away the metal. The laser light from the lasers located below the bottom surface has a wavelength such that the laser light passes through the substrate and is absorbed by the bond layer to selectively heat up and vaporize the metallic layer. The wavelength of light produced by the one or more lasers located above the top surface of film 313 and the wavelength of light produced by the one or more lasers located below the bottom surface of film 313 may be different. The wavelength of light produced by the one or more lasers located above the top surface of film 313 and the wavelength of light produced by the one or more lasers located below the bottom surface of film 313 may be substantially the same.

In some other embodiments, film 313 is preferably similar to film 203 or film 204 as shown in FIG. 2C and FIG. 2D, respectively, and described above. In these embodiments, laser light from one or more lasers located above the top surface of film 313 impinges directly on the top surface metallic layer to selectively ablate away the top surface metallic layer and laser light from one or more lasers located below the bottom surface of film 313 impinges directly on the bottom surface metallic layer to selectively ablate away the bottom surface metallic layer.

Figure 3C:
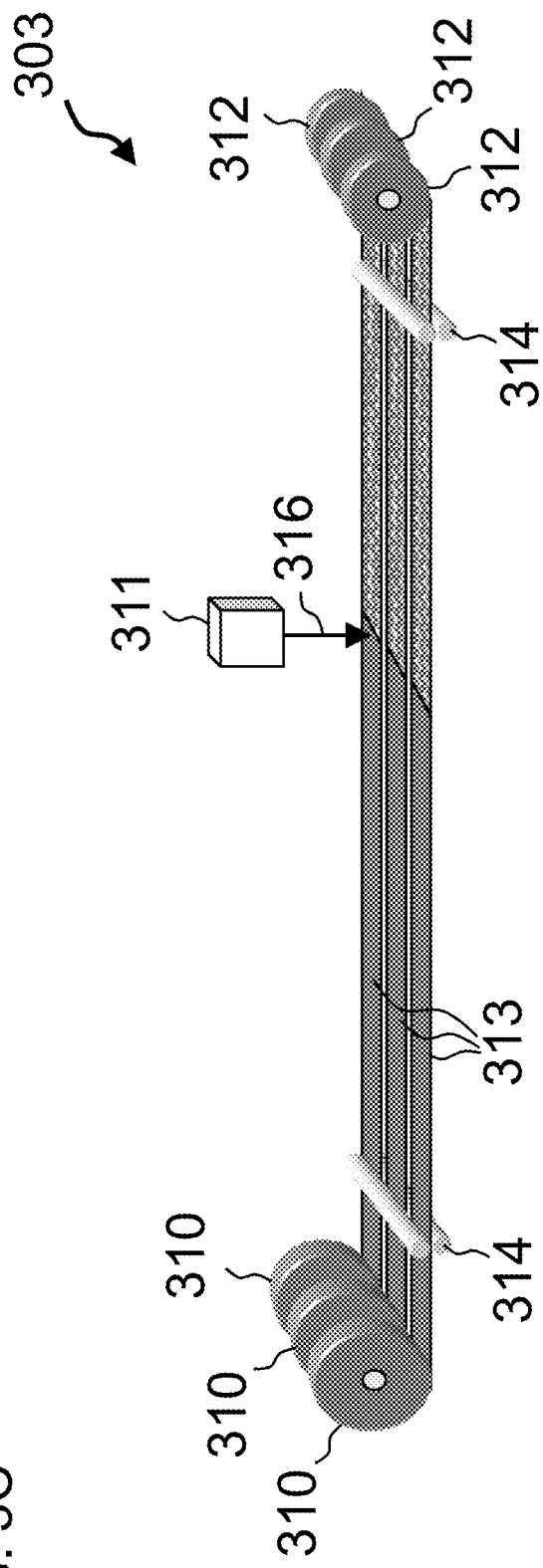
FIG. 3C is a perspective diagram of a laser ablation system according to some embodiments of the present invention.

FIG. 3C is a diagram of a laser ablation system 303 according to some embodiments of the present invention. Laser ablation system 303 is similar to laser ablation system 301 as described above except that laser ablation system 303 includes multiple cylindrical payoff spools 310 and multiple cylindrical take up spools 312 in order to load multiple spools of film, thereby allowing for the ablation process to be applied to multiple films 313 simultaneously. Single laser 311 emits laser light 316 to ablate the multiple films 313 and may be located on a moveable stage that allows the single laser 311 to move in multiple directions, thereby allowing the laser light 316 from single laser 311 to selectively ablate the metallic layer from the multiple films 313. A mechanically or electrically controlled mirror can also be used to reflect the laser light from the single laser 311 to selectively ablate the metallic layer from the multiple films 313. Multiple lasers 311 can be utilized in a similar manner.

Figure 3D:
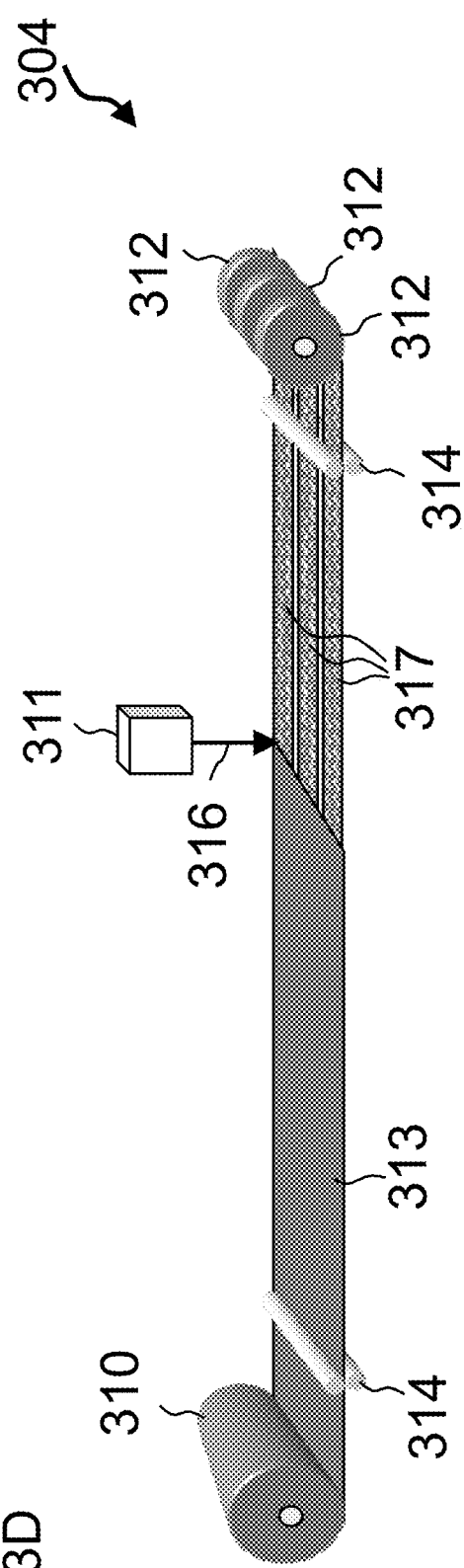
FIG. 3D is a perspective diagram of a laser ablation system according to some embodiments of the present invention.

FIG. 3D is a diagram of a laser ablation system 304 according to some embodiments of the present invention. Laser ablation system 304 is similar to laser ablation system 301 as described above except that laser ablation system 304 includes a cylindrical payoff spool 310 capable of accepting spools of film having a width that is greater than at least twice the width of a single cable wrap film to payoff single film 313. Cutting mechanisms (which may include laser cutting tools) are used to divide the single film 313 into multiple films 317, each film 317 having a width appropriate for use as a cable wrap, and multiple cylindrical take up spools to take up the multiple films 317 after the films 317 have been patterned. Single laser 311 emits laser light 316 to ablate the multiple films 313 and may be located on a moveable stage that allows the single laser 311 to move in multiple directions, thereby allowing the laser light 316 from single laser 311 to selectively ablate the metallic layer from the multiple films 313. A mechanically or electrically controlled mirror can also be used to reflect the laser light from the single laser 311 to selectively ablate the metallic layer from the multiple films 313.

Laser based ablation systems 301, 302, 303, and 304 are used to produce a fixed pattern, a random collection of shapes, and/or a pseudo-random pattern of mosaic tape capable of being used as a cable tape. The random or pseudo-random pattern lengths of discontinuous metallic shapes reduce or substantially eliminate the interaction between the mosaic tape and the internal twisted pairs. The fixed, random and/or pseudo-random pattern lengths of discontinuous metallic shapes may be alternatively manufactured with the use of a mechanical (e.g., selective controlled milling) or an electrical based (e.g., selective controlled arcing) ablation systems to produce a random effect or a long period pattern length of mosaic tape.

The use of fixed, random and/or pseudo-random patterns of discontinuous metallic shapes substantially reduces the magnetic and electric field coupling between neighboring cables and more specifically prevents unwanted coupling between the twisted pairs within the cable and the mosaic tape which would result in a high coupling between neighboring cables. In some embodiments, a pseudo-random pattern could have a period of about 5.0 m or in a range between 0.1 m and 100 m.

Figure 4D:
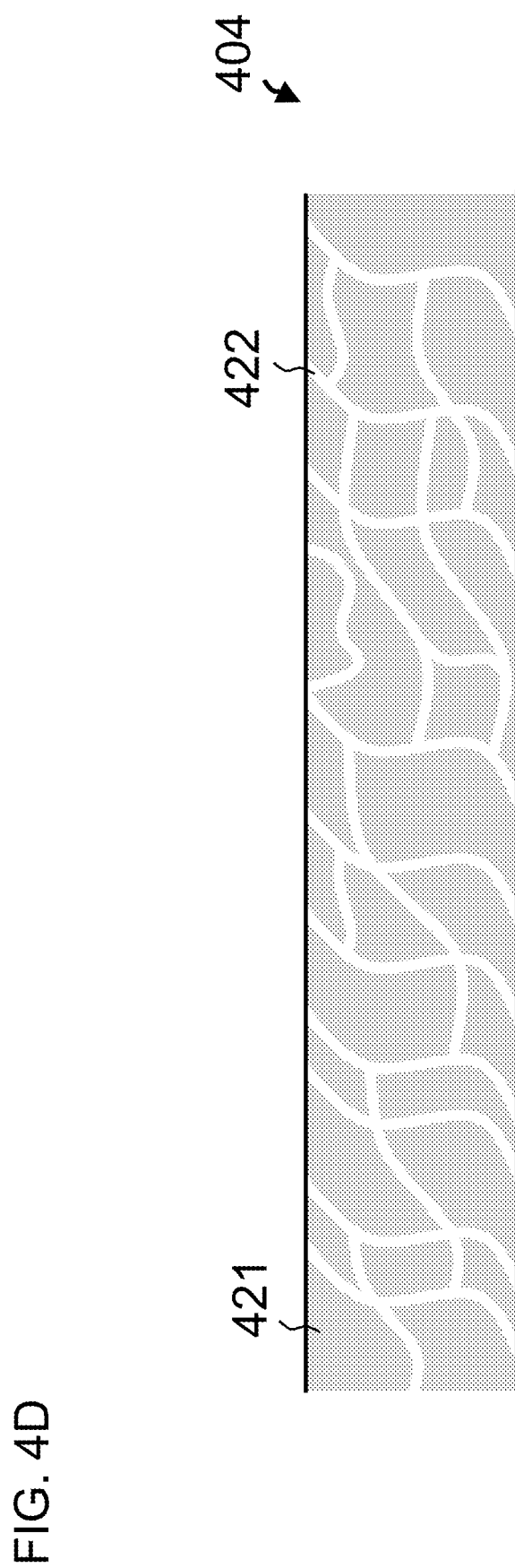
FIG. 4D is a top view of another random or pseudo-random mosaic tape according to some embodiments of the present invention.

FIGS. 4A, 4B, 4C, and 4D are diagrams showing different possible mosaic patterns 401, 402, 403, and 404, respectively, that a laser ablation system according to some embodiments of the present invention can produce. In FIG. 4A, a fixed pattern 401 is shown wherein the metallic shapes 421 are shown in gray and the white regions or gaps 422 represent areas wherein the metallic layer has been ablated away. In FIGS. 4B and 4C, random patterns (402 and 403) are shown. In FIG. 4D a random distribution of randomized shapes 404 having non-linear (i.e., curved) ablated regions or paths is shown. The pattern ablated into the metallic layer of the film or tape is preferably chosen to reduce alien crosstalk. This film or tape can then be wrapped around the twisted-wire pairs within a cable such that the film or tape can cover the internal pairs once or multiple times in order to improve the coupling attenuation, thereby reducing the alien crosstalk that would result from interactions with nearby cables.

For fixed-length metallic patterns of the mosaic tape, the effective wire-pair twist lay $(1/[\{1/\text{pair lay}\}+\{1/\text{strand lay}\}]$ must be designed so as not to create undesired electromagnetic coupling between the tape and wire-pair. Undesired electromagnetic coupling occurs to a greater extent when integer or ½ integer numbers of wire-pair twist periods are directly below a metallic shape. If this condition occurs over a number of successive metallic shapes, a periodic signal is imparted onto the successive metallic shapes which couples efficiently to neighboring cables (particularly to cables of similar construction). The frequency of this interaction between the tape and the wire-pair is associated with how close the effective wire-pair twist period is to the integer or ½ integer related mosaic length. For example, if the wire-pair twist period is exactly equal to the metallic shape length the frequency is low. As the wire-pair twist period gets slightly larger or smaller than the mosaic shape length the frequency increases. The most sensitive frequencies are the ones that lie in the frequency range that the application requires (e.g., 10G Base-T requires a frequency range between 1 MHz and 500 MHz). Hence it is preferable for there to be no undesired couplings in the frequency range of interest. Therefore, a region of lengths about the integer or ½ integer related mosaic length define the frequency range that must be avoided for a particular application (e.g., 10G Ethernet). These regions of lengths define "keep-out" zones for the effective wire-pair twist period. Hence fixed-length mosaic patterns can be designed in this way to prevent unwanted electromagnetic coupling from occurring in the frequency range of interest. A completely random shape distribution and/or pseudo random pattern can be employed which substantially eliminates the unwanted coupling from occurring.

Figure 5:
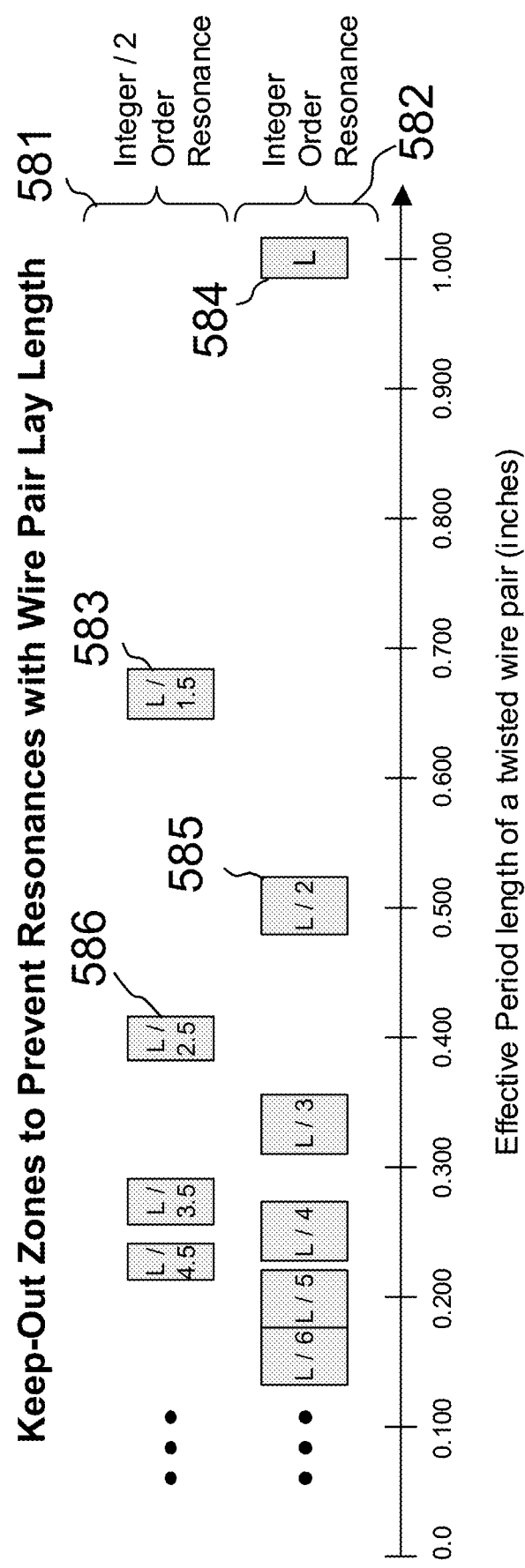
FIG. 5 is a graph showing keep-out areas of effective pair lay lengths for preventing electromagnetic coupling when a mosaic tape is used with a fixed length (L) of metallic shapes according to some embodiments of the present invention.

FIG. 5 shows a graph 501 of keep-out areas (to obtain effective pair lay lengths) when a mosaic tape is used with metallic shapes having a fixed length period L, where L is the length of the metallic shape plus the width of the gap between adjacent metallic shapes. Note that for FIG. 5, L=1.0 inches, but the graph can be scaled for other values of L. Avoiding the keep-out areas prevents or reduces unwanted electromagnetic coupling from occurring in the alien crosstalk frequency spectrum of interest. Specifically, FIG. 5 shows a graph 501 that demonstrates an example of the relationship between the fixed pattern length (L) of the metallic shapes in the mosaic tape and the effective pair lay length (which is equal to the pair lay length combined with the strand lay length) within a cable. The relationship is shown or described, as "keep-out" zones (i.e., the gray boxes in the graph) where the effective pair lay length of each of the wire pairs within the cable should not reside or where the length (L) of the fixed length metallic shapes should be changed to accommodate the effective pair lay length set. For example, referring to FIG. 5, if the fixed length of the metallic shapes is L then keep-out zone 584 dictates that the effective pair lay length should not be around 1.000 inch (i.e., it should be outside of the length assigned by the grey box 584). An alternative way of utilizing FIG. 5 is as follows: for an effective pair lay length of 0.500 inch, keep-out zone 585 dictates that the fixed length of the metallic shapes should not be L. The length L of the metallic shapes combined with the gaps must either be increased or decreased to shift the box 585 to the right or left of the pair lay length of 0.5 inch. Note that the higher order terms of the integer components 582 (e.g. L/N where N is large) or the half integer components 581 (e.g., NL/2 where N is large and odd) do not result in a strong interaction between the twisted wire-pair and the mosaic metallic pattern due to the number of wire-pair twist periods interacting with one metallic shape. These higher order terms result in a much smaller contribution to alien crosstalk.

For a metallic shape length of L=1.0 inches, a strand lay of 4.0 inches, and four twisted pairs having pair lays of 0.5 inches (pair 1, effective pair lay of 0.444 inches), 0.65 inches (pair 2, effective pair lay of 0.559 inches), 0.74 inches (pair 3, effective pair lay of 0.6245 inches), and 0.86 inches (pair 4, effective pair lay of 0.708 inches), it can be seen from FIG. 5 that all of the effective pair lays avoid the keep out zones. As the low order keep-out zones 583-586 are missed, the mosaic tape/strand lay/pair lays combination performs adequately.

Figure 6:
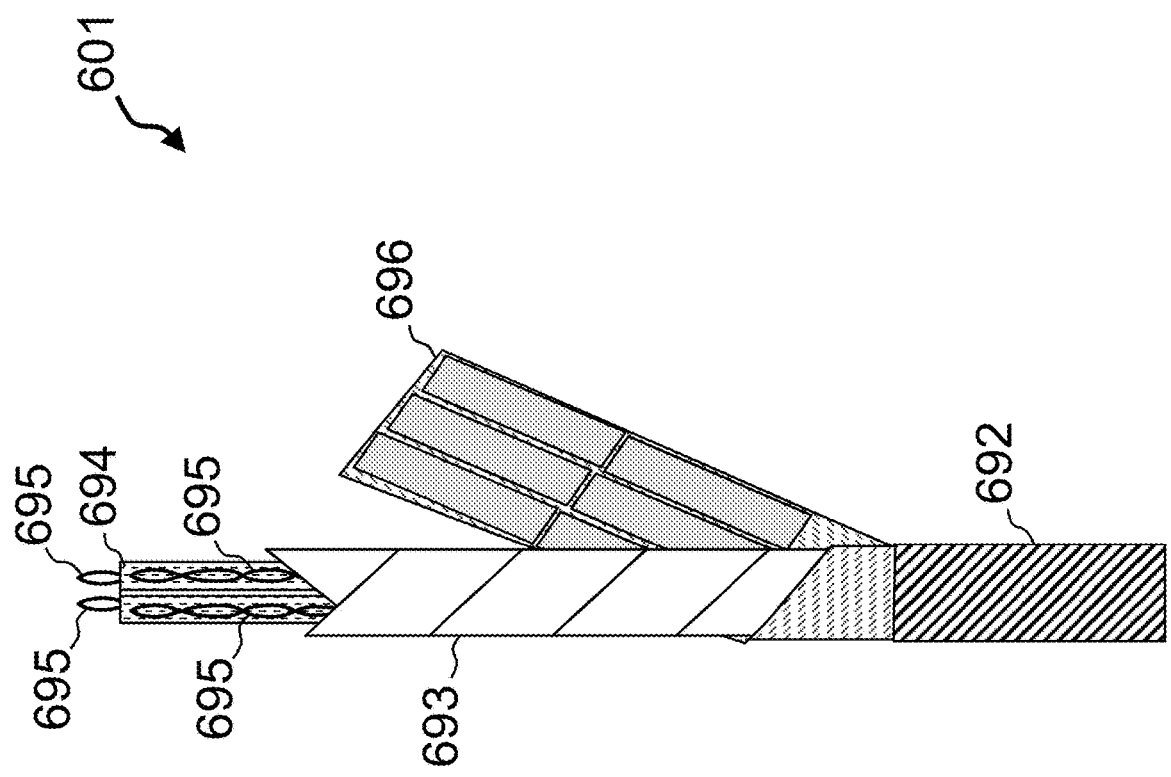
FIG. 6 is a partially exploded, fragmentary view of an embodiment of a cable with a mosaic tape according to the present invention.

Following fabrication of the mosaic tape according to the present invention, mosaic tape 696 can be integrated into a communication cable construction 601 as shown in FIG. 6. In FIG. 6 a barrier tape 693 is wrapped around the twisted pairs 695 and wire-pair separator 694. The mosaic tape 696 is wrapped over this assembly and the jacket 692 surrounds the mosaic tape 696.

One of the advantages of the present invention is that a laser ablation method to produce the mosaic tape can create relatively thin gaps or voids between conductive elements when compared to mechanical die cutting methods. A thin gap is preferred because it has improved electric field and magnetic field shielding characteristics. Consequently, mosaic tapes manufactured according to the present invention can have conductive elements on a single side of the tape, and such structure has the same performance, or nearly the same performance, as mosaic tapes manufactured with a die cutting method with conductive elements on both sides of the tape. Additionally, the mosaic tape according to the present invention can be manufactured at a substantially lower cost compared to other tapes.

Another technique for reducing unwanted couplings is to randomize the twist periods of the twisted wire-pairs within a cable. The resulting random relationships between a fixed (or random) pattern on the mosaic tape reduces couplings and removes the dependency of the twisted wire-pairs' twist period to the periodicity of the mosaic's metallic shapes.

Alternatively, or additionally, a mosaic tape having a fixed periodicity of metallic shapes may be wrapped around a cable core having a randomized strand lay (sometimes called cable lay). In this fashion, the twisted wire-pairs interact with the metallic shapes with a randomized interaction length, which reduces unwanted couplings.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A communication cable comprising:
   at least one pair of twisted conductors;
   a film comprising a metallic layer including a design, wherein the design is formed by including a gap between shapes in the metallic layer, the gap being a predetermined distance; and
   wherein the design is provided along a length of the film such that a first shape and a second shape positioned across a common gap are different within the length of the film.

2. The communication cable of claim 1, wherein the predetermined distance is a width distance that falls between 5 mil to about 0.5 mil.

3. The communication cable of claim 1, wherein the design includes shapes arranged in a random layout within the length of the film on the metallic layer.

4. The communication cable of claim 1, wherein the design includes shapes arranged in a pseudo-random layout within the length of the film on the metallic layer.

5. The communication cable of claim 1, wherein the design includes shapes arranged in a predetermined layout within the length of the film on the metallic layer.

6. The communication cable of claim 1, wherein the design includes shapes formed into a plurality of rows within the length of the film, wherein the shapes are separated by the gap.

7. The communication cable of claim 1, wherein the design includes a plurality of different shapes, each shape having a respective predetermined length.

8. The communication cable of claim 1, wherein the design includes a pattern of shapes repeated at a periodic interval distance that falls between 1 to 3 inches.

9. The communication cable of claim 1, wherein the design includes a pattern of shapes repeated at a periodic interval distance that is greater than 3 inches.

10. The communication cable of claim 1, wherein the design includes a pattern of shapes repeated at a periodic interval distance that falls between 4 to 6 inches.

11. The communication cable of claim 1, wherein the film further comprises:
    a bond layer and a substrate layer.

12. The communication cable of claim 11, wherein the bond layer is between the metallic layer and the substrate layer.

13. The communication cable of claim 11, wherein the design is further included in the bond layer.

14. The communication cable of claim 1, wherein the at least one pair of twisted conductors includes a predetermined strand lay.

15. The communication cable of claim 1, wherein the at least one pair of twisted conductors includes a predetermined pair lay.

16. The communication cable of claim 1, wherein the at least one pair of twisted conductors include an effective pair lay length and the design repeats shapes or patterns according to a period; and wherein the communication cable is configured to select the effective pair lay length and the period to avoid a predetermined keep-out zone.

17. The communication cable of claim 1, wherein the film is wrapped around at least a portion of the at least one pair of twisted conductors.

18. The communication cable of claim 1, wherein the metallic layer has a thickness of between 0.1 micrometer to 100 micrometer.

19. The communication cable of claim 1, wherein the design is repeated at a periodic interval distance that falls between 4 to 6 inches.

\* \* \* \* \*